United States Patent
Fukazawa et al.

(10) Patent No.: US 7,229,935 B2
(45) Date of Patent: Jun. 12, 2007

(54) METHOD OF FORMING A THIN FILM BY PLASMA CVD OF A SILICON-CONTAINING SOURCE GAS

(75) Inventors: Atsuki Fukazawa, Tama (JP); Kenichi Kagami, Tama (JP); Manabu Kato, Tama (JP)

(73) Assignee: ASM Japan K.K., Tokyo (JP)

( * ) Notice: Subject to any disclaimer, the term of this patent is extended or adjusted under 35 U.S.C. 154(b) by 215 days.

(21) Appl. No.: 10/932,816

(22) Filed: Sep. 2, 2004

(65) Prior Publication Data

US 2005/0048797 A1 Mar. 3, 2005

(30) Foreign Application Priority Data

Sep. 3, 2003 (JP) .............................. 2003-311705

(51) Int. Cl.
*H01L 21/471* (2006.01)
*C23C 16/22* (2006.01)

(52) U.S. Cl. ...................... 438/788; 438/789; 427/578; 427/588

(58) Field of Classification Search ................ 427/588, 427/591
See application file for complete search history.

(56) References Cited

U.S. PATENT DOCUMENTS

| | | | | |
|---|---|---|---|---|
| 5,714,408 A | * | 2/1998 | Ichikawa et al. | ............ 438/761 |
| 5,741,740 A | * | 4/1998 | Jang et al. | .................. 438/435 |
| 6,530,380 B1 | * | 3/2003 | Zhou et al. | .................. 134/1.2 |
| 6,991,959 B2 | * | 1/2006 | Goundar et al. | ............ 438/105 |
| 2004/0076767 A1 | | 4/2004 | Satoh et al. | |
| 2004/0253828 A1 | * | 12/2004 | Ozawa et al. | ................ 438/710 |

* cited by examiner

*Primary Examiner*—Stephen W. Smoot
(74) *Attorney, Agent, or Firm*—Knobbe, Martens Olson & Bear LLP

(57) ABSTRACT

A method for forming a thin film includes: supplying an additive gas, a dilution gas, and a silicon-containing source gas into a reaction chamber wherein a substrate is placed; forming a thin film on the substrate by plasma CVD under a given pressure with a given intensity of radio-frequency (RF) power from a first point in time to a second point in time; at the second point in time, stopping the supply of the silicon-containing source gas; and at the second point in time, beginning reducing but not stopping the RF power, and beginning reducing the pressure, wherein the reduction of the RF power and the reduction of the pressure are synchronized up to a third point in time.

26 Claims, 3 Drawing Sheets

METHOD OF FORMING A THIN FILM BY PLASMA CVD OF A SILICON-CONTAINING SOURCE GAS

BACKGROUND OF THE INVENTION

1. Field of the Invention

The present invention generally relates to a method for forming a thin film in a semiconductor device circuit manufacturing process; and particularly to a method for forming a thin film, which reduces plasma damage in plasma CVD.

2. Description of the Related Art

Conventionally, as a method for forming a thin film on a semiconductor substrate, plasma CVD (chemical vapor deposition) has been used. This method forms a thin film on a semiconductor substrate by a chemical reaction caused by maintaining a pressure inside a reaction chamber; keeping a semiconductor substrate temperature by raising a temperature of a susceptor in which a resistance-heating type heater is laid buried; generating plasma discharge in a space between the susceptor and a shower plate for emitting a jet of reaction gas by applying radio-frequency power to the shower plate. Interlayer insulation films, passivation films, antireflection films and others are formed by plasma CVD.

In recent years, as miniaturization of semiconductor devices has been pursued, copper (Cu) became used in place of aluminum (Al) as a material for interconnections in order to prevent an increase in RC delays. Cu is characterized in that having excellent thermal durability and low resistance values as compared with Al. Similarly, lower dielectric constants are demanded for interlayer insulation films.

In design rules for interlayer insulation films having a thickness of 130 nm, SiOF films or TEOS oxide films having dielectric constants of approximately 3.4-3.7 have been used. With the miniaturization being pursued, low dielectric constant interlayer insulation films (low-k films) having dielectric constants of 3.0 or less have become used because a thickness of the interlayer films falls below 100 nm. Because the low-k films contain carbon in oxide film bonding, the films have a drawback of low mechanical strength as compared with TEOS oxide films. This tendency becomes clear in ultra-low-k films (ULK films) having dielectric constants of 2.4-2.7, which are used for the next-generation 65 nm rules. This mechanical strength brittleness poses a problem in the Damascene process.

The Damascene process here includes the steps of: forming a trench within a desired lead pattern; filling the trench with metal or other conductive materials; etching back or polishing the metal up to an insulation layer. Interconnections stay in the trench and are mutually insulated within the desired pattern. The Dual-Damascene process, which is a developed type of the Damascene process, includes the steps of: forming two insulation layers separated by an etch stop material; and forming a trench within an upper insulation layer. A contact-via is etched through the bottom of the trench and a downside insulation layer so as to expose a downside conductive member to be contacted. In the Damascene process, low-k films, Cu which is an interconnection material, SiC films for preventing Cu diffusion, SiC hardmask films and others are used. In the Dual-Damascene process which provides a via layer and a trench layer, low-k films of different film types are often used for respective layers. For example, a spin-on type low-k film is used for one; a plasma type low-k film is used for the other. Semiconductor devices are configured by laminating these low-k films. In such cases, adhesion among plasma type low-k films having low mechanical strength, SiO or SiC films having high mechanical strength and spin-on type low-k films becomes a problem.

In plasma CVD, plasma damage has been a problem. Due to charge-up caused by plasma, electric charge accumulated on a semiconductor substrate flows to ground potential through a susceptor heater as leakage current. If the leakage current exceeds a certain value, a gate insulation film of a semiconductor apparatus is deteriorated or destroyed, thereby lowering a semiconductor apparatus yield rate. This is called plasma damage. Additionally, as leakage current, lateral leakage current, which depends on a surface potential distribution within a semiconductor substrate surface, also exists.

In order to improve the plasma damage problem, a method for anodizing a susceptor for the purpose of improving electrode insulation performance caused by discharge, a method for pre-coating a susceptor before the thin-film formation process for the purpose of improving the insulation performance and other methods have been proposed. These methods, however, have problems of process-gas resistance, plasma resistance and heat resistance of anodic oxide films and of exfoliation of precoat films; in order to solve these problems, methods using alloy materials excellent in corrosion resistance and resistance properties were proposed (For example, Japanese Patent Laid-open No. 1999-229185).

As an alternative method for improving the plasma damage problem, there is a method increasing a pressure as well as reducing an amount of radio-frequency plasma applied at the time of thin-film formation. This method, however, has a problem because changing the process conditions changes film properties. Conversely, if the plasma amount applied is increased, sheath voltage is increased and damage on a semiconductor substrate occurs. In order to solve this problem, a method which reduces the damage by controlling the sheath voltage without changing the plasma amount applied was invented (For example, Japanese Patent Laid-open No. 2003-45849).

SUMMARY OF THE INVENTION

Consequently, in an aspect, an object of the present invention is to provide a method for forming a thin film, which reduces plasma damage.

In another aspect, an object of the present invention is to provide a method for forming a thin film, which improves adhesion between thin films.

In still another aspect, an object of the present invention is to provide a method for forming a thin film, which inhibits particle contamination caused by silicon-containing source gases.

In yet another aspect, an object of the present invention is to provide a method for forming a thin film, which inhibits the occurrence of sticking.

The present invention can accomplish one or more of the above-mentioned objects in various embodiments. However, the present invention is not limited to the above objects, and in embodiments, the present invention exhibits effects other than the objects.

In an aspect, the present invention provides a method for forming a thin film comprising: (i) supplying an additive gas, a dilution gas, and a silicon-containing source gas into a reaction chamber wherein a substrate is placed; (ii) forming a thin film on the substrate by plasma CVD under a given pressure with a given intensity of radio-frequency (RF) power from a first point in time to a second point in time;

(iii) at the second point in time, stopping the supply of the silicon-containing source gas; and (iv) at the second point in time, beginning reducing but not stopping the RF power, and beginning reducing the pressure, wherein the reduction of the RF power and the reduction of the pressure are synchronized up to a third point in time.

The above embodiment includes, but is not limited to, the following embodiments:

At the third point in time, the RF power may be about 90% to about 10% (including 80%, 70%, 60%, 50%, 40%, 30%, 20%, and ranges between any two numbers of the foregoing e.g., about ⅔ to about ¼) of that at the second point in time. The RF power may be reduced at a constant rate between the second point in time and the third point in time. At the third point in time, the RF power may be discontinued.

Further, between the second point in time and the third point in time, the dilution gas may be continuously supplied. Between the second point in time and the third point in time, the dilution gas flow may be constant. The dilution gas may be at least one selected from the group consisting $N_2$, He, Ar, Kr, and Xe.

The supply of the additive gas may begin before the supply of the silicon-begins, containing gas begins, and the supply of the additive gas may stop when the supply of the silicon-containing gas begins. Alternatively, the supply of the additive gas may begin when the supply of the silicon-containing gas begins, and the supply of the additive gas may stop at the third point in time. Between the first point in time and the second point in time, the additive gas flow may be reduced. The additive gas may be at least one selected from the group consisting of $CO_2$, CO, $O_2$, $H_2$, $C_nH_{2n+2}$ (n=1-5), and $C_nH_{2n+2}O$ (n=1-5).

The supply of the silicon-containing gas may begin a given time period before the first point in time, said given time period being longer than a time period between the first point in time and the second point in time (e.g., 10%, 25%, 50%, 75% longer). However, if the pressure is stabilized quickly, the given time period can be the same as or shorter than the time period between the first point in time and the second point in time. The silicon-containing source gas may be at least one selected from the group consisting of $SiH_4$, TEOS, and $Si_aO_{a-1}R_{2a-b+2}(OC_nH_{2n+1})_b$, wherein a=1-3; b=0, 1 or 2; n=1-3; R is hydrocarbon of $C_{1-6}$ bonded to Si.

A time period between the second point in time and the third point in time may be about 5 sec to about 20 sec (e.g., 10±3 sec). Between the first point in time and the second point in time, the pressure, the RF power, and the silicon-containing gas flow may be constant.

Thin film formed on the substrate may be constituted by any type of silicon-containing dielectric such as silicon oxide, depending on the type of source gas and additive gas.

In another aspect, the present invention provides a method for forming a thin film comprising: (i) placing a semiconductor substrate into a reaction chamber; (ii) heating the semiconductor substrate at a given temperature; (iii) introducing an additive gas into the reaction chamber; (iv) introducing a given amount of dilution gas into the reaction chamber; (v) introducing a given amount of silicon-containing source gas into the reaction chamber and maintaining a pressure inside the reaction chamber at a given level; (vi) applying radio-frequency power to the inside of the reaction chamber; (vii) stopping supplying the silicon-containing source gas; (viii) simultaneously when supplying the silicon-containing source gas is stopped, reducing the pressure inside the reaction chamber and the amount of the radio-frequency power to a desired level progressively at a given rate; (ix) stopping applying the radio-frequency power; and (x) stopping supplying the dilution gas.

The above embodiment includes, but is not limited to, the following embodiments:

The given temperature may be about 50° C. to about 550° C.

The additive gas may be at least one selected from the group consisting of $CO_2$, CO, $O_2$, $H_2$, $C_nH_{2n+2}$ (n=1-5) and $C_nH_{2n+2}O$ (n=1-5). The dilution gas may be at least one selected from the group consisting of $N_2$, He, Ar, Kr, and Xe. The silicon-containing source gas may be at least one selected from the group consisting of $SiH_4$, TEOS, and $Si_aO_{a-1}R_{2a-b+2}(OC_nH_{2n+1})_b$, wherein a=1-3; b=0, 1 or 2; n=1-3; R is hydrocarbon of $C_{1-6}$ bonded to Si.

The given amount of the additive gas may be about 5 sccm to about 1000 sccm. The given amount of the dilution gas may be about 10 sccm to about 1000 sccm. The given amount of the silicon-containing source gas may be about 50 sccm to about 400 sccm.

The given pressure level may be about 1 Torr to about 30 Torr. The radio-frequency power may have a frequency of about 13.56 MHz to about 60 MHz and a power of about 500 W to about 4,000 W.

The desired level may be from about ⅔ to about ¼ of that before the reduction of the pressure inside the reaction chamber and the amount of the radio-frequency power.

In all of the aforesaid embodiments, any element used in an embodiment can interchangeably be used in another embodiment unless such a replacement is not feasible or causes adverse effect. Further, the present invention can equally be applied to apparatuses and methods.

In at least one embodiment of the present invention, it is possible to reduce the plasma damage occurrence when the applying of the radio-frequency power is stopped. Further, in at least one embodiment of the present invention, because adhesion of films having low mechanical strength such as low-k films and ULK films to thin films formed in the subsequent process can be improved, exfoliation and scratches caused in a CMP (Chemical Mechanical Polishing) process can be prevented. Additionally, in at least one embodiment of the present invention, because of low rest potential, the occurrence of sticking can be prevented. Furthermore, in at least one embodiment of the present invention, particle contamination caused by residual silicon-containing source gas components can be controlled.

For purposes of summarizing the invention and the advantages achieved over the related art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

DETAILED DESCRIPTION OF THE PREFERRED EMBODIMENT

Figure 1:
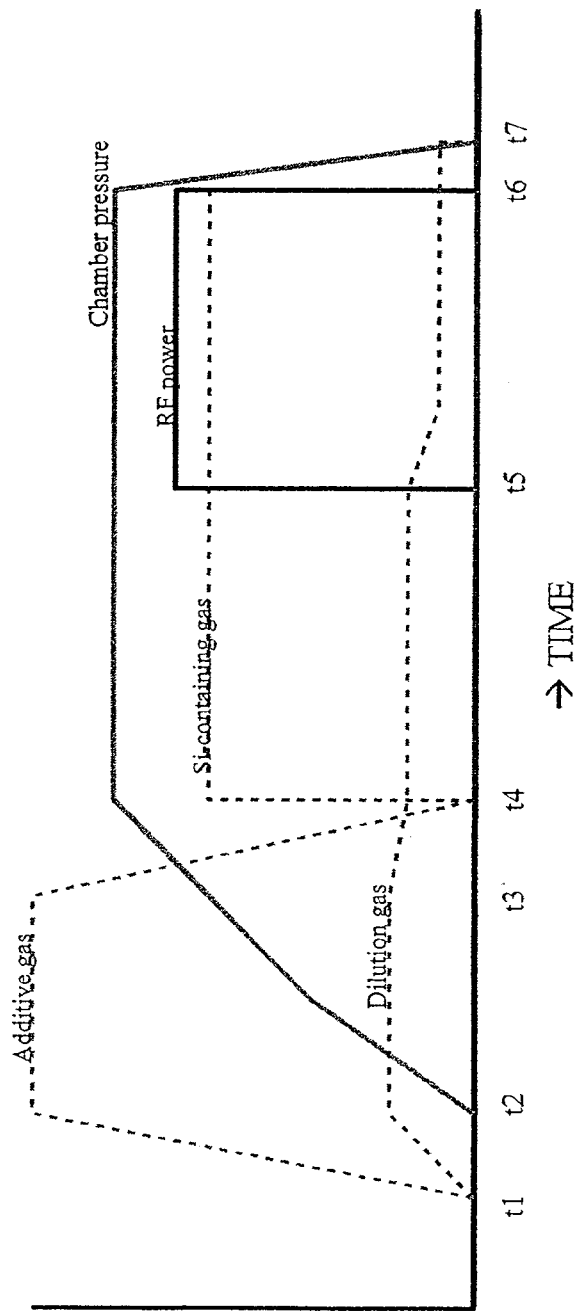
FIG. 1 is a diagram showing a thin-film formation sequence according to a comparative technology.

As described above, in an aspect of the present invention, a thin film can be formed by first (i) supplying an additive gas, a dilution gas, and a silicon-containing source gas into a reaction chamber wherein a substrate is placed; (ii) forming a thin film on the substrate by plasma CVD under a given pressure with a given intensity of radio-frequency (RF) power from a first point in time (e.g., t5 in FIG. 2) to a second point in time (e.g., t6' in FIG. 2); (iii) at the second point in time, stopping the supply of the silicon-containing source gas; and (iv) at the second point in time, beginning reducing but not stopping the RF power, and beginning reducing the pressure, wherein the reduction of the RF power and the reduction of the pressure are synchronized up to a third point in time (e.g., t7' in FIG. 2).

In the above, the term "at the point in time" may mean either "around the point in time", "substantially or nearly at the point in time, or exactly at the point in time", as long as at least one of the objects described earlier can be accomplished. For example, a time difference of about ±10 sec. may mean "at the second point in time". Further, the term "synchronize" may mean to move or occur at the same time or to cause to agree in time, and the above explanation of "at the point in time" applies. In an embodiment, the term "synchronize" may mean to move at corresponding (different or same) or matching rates. For example, between the second point in time and the third point in time (e.g., 5–20 sec, preferably 7–15 sec), the RF power is reduced at a constant rate (e.g., by 20% to 80%, preferably by 40%–60%), while the pressure is reduced at a constant rate (e.g., by 10% to 60%, preferably by 20%–40%). The reductions of the RF power and the pressure need not be conducted at a constant rate. When the reductions of the RF power and the pressure are synchronized, uniformity of plasmas can be improved. If they are not synchronized, when plasmas are ceased, localization of plasmas or convergence of plasmas may occur.

During the time period between the second point in time and the third point in time, preferably, the dilution gas is continuously supplied preferably at a constant rate, so that adhesion of the film can be improved, even though film formation is complete at the second point in time.

Preferred embodiments of the present invention are described with reference to drawings attached, but the invention should not be limited thereto.

In preferred embodiments, a semiconductor substrate, which is an object-to-be-processed, is carried into a reaction chamber having an atmospheric pressure of 0.1 Torr to 100 Torr, preferably about 1 Torr to about 30 Torr (including 5 Torr, 10 Torr, 20 Torr, and ranges between any two numbers of the foregoing) and is placed on a susceptor having a resistance-heating type heater whose temperature is raised at 0° C. to 1000° C., preferably about 50° C. to about 550° C. (including 100° C., 200° C., 300° C., 400° C., and ranges between any two numbers of the foregoing). From a showerhead disposed parallel to and facing the susceptor, process gases for forming a thin film are introduced. The process gases here comprise a silicon-containing source gas to be selected from a group consisting of $SiH_4$, TEOS (tetra-ethyl-ortho-silicate) and $Si_aO_{a-1}R_{2a-b+2}(OC_nH_{2n+1})_b$ (a=1–3; b=0, 1 or 2; n=1–3; R is hydrocarbon of $C_{1-6}$ bonded with Si), an additive gas which is any one or a combination of $CO_2$, CO, $O_2$, $H_2$, $C_nH_{2n+2}$ (n=integers from 1 to 5) and $C_nH_{2n+2}O$ (n=integers from 1 to 5), and a dilution gas to be selected from a group consisting of $N_2$, He, Ar, Kr and Xe.

In preferred embodiments, a flow rate of the silicon-containing source gas is 10 sccm to 1000 sccm, preferably about 50 sccm to about 400 sccm (including 100 sccm, 200 sccm, 300 sccm, and ranges between any two numbers of the foregoing), a flow rate of the additive gas is 2 sccm to 3000 sccm, preferably about 5 sccm to about 1000 sccm (including 50 sccm, 100 sccm, 250 sccm, 500 sccm, 750 sccm, and ranges between any two numbers of the foregoing), and a flow rate of the dilution gas is 2 sccm to 3000 sccm, preferably about 10 sccm to about 1000 sccm (including 50 sccm, 100 sccm, 250 sccm, 500 sccm, 750 sccm, and ranges between any two numbers of the foregoing). Preferably, a temperature of the showerhead is set at 0° C. to 500° C., preferably about 50° C. to about 350° C. (including 100° C., 200° C., 300° C., and ranges between any two numbers of the foregoing). Radio-frequency of 2 MHz to 100 MHz, preferably about 13.56 MHz to about 60 MHz (including 20 MHz, 40 MHz, and ranges between any two numbers of the foregoing; in an embodiment, low frequency such as 100 kHz to 1 MHz may be overlaid) is applied to the showerhead at 100 W to 6,000 W, preferably about 500 W to about 4,000 W (including 1,000 W, 2,000 W, 3,000 W, and ranges between any two numbers of the foregoing). Plasma discharge is generated in a reaction space between the susceptor and the showerhead; the process gases are decomposed on the semiconductor substrate and a chemical reaction takes place; thus, a thin film is formed.

The above conditions are preferred embodiments, and are not intended to restrict the present invention.

Figure 2:
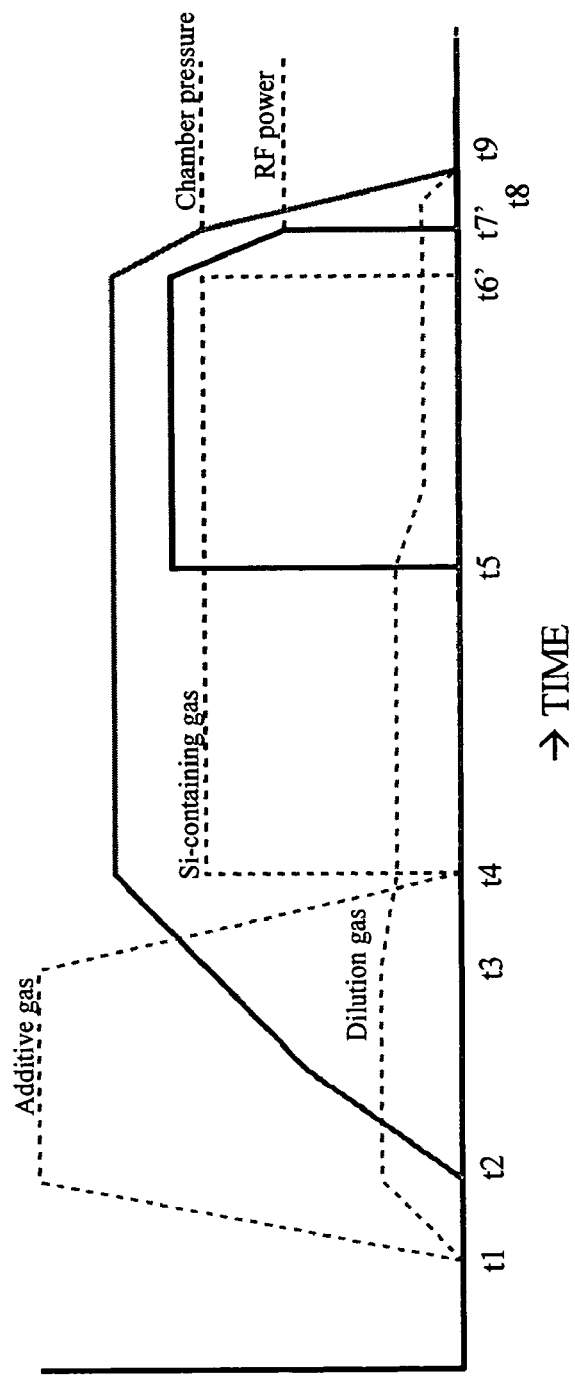
FIG. 2 is a diagram showing a thin-film formation sequence according to an embodiment of the present invention.

Generally, thin-film formation in a plasma CVD apparatus is automatically performed in a sequence including the steps of introducing process gases, applying radio-frequency power, forming a thin film and stopping applying plasma. FIG. 1 and FIG. 2 respectively show a sequence according to a comparative technology and a sequence according to a preferred embodiment of the present invention. FIG. 1 and FIG. 2 are not scaled proportionally but simply show the sequence or the timing.

As shown in FIG. 1, in the comparative thin-film formation sequence, introducing an additive gas and a dilution gas is started at Time t1; subsequently at Time t2, respective flow rates of the additive gas and the dilution gas are gradually increased until given flow rates are achieved. At Time t2, a pressure inside the reaction chamber starts rising. At Time t3, decreasing a flow rate of the additive gas is started; at Time t4, supplying the additive gas is stopped. Simultaneously at Time t4, a silicon-containing source gas is introduced at a given flow rate and a pressure inside the reaction chamber is maintained at a desired pressure level. At Time t5, applying radio-frequency power to the showerhead is started; until Time t6, plasma discharge is continued. At Time t6, applying radio-frequency power and supplying the silicon-containing source gas are stopped simultaneously; decreasing a pressure inside the reaction chamber is started by evacuating the inside of the reaction chamber. At Time t7, supplying the dilution gas is stopped and the thin-film formation sequence is finished by setting a pressure inside the reaction chamber at zero.

In this comparative sequence, at Time t6, a pressure inside the reaction chamber is maintained at about 1 Torr to about 30 Torr and residual silicon-containing source gas remains inside the reaction chamber. At this point in time, if applying the radio-frequency power is stopped, plasma momentarily becomes unstable. Due to this momentary instability, the semiconductor substrate becomes charged unevenly and in-plane uniformity of a surface potential is worsened. In this case, in-plane distribution uniformity of plasma damage is about 0.5% to about 0.9%; the occurrence of lateral leakage current becomes a problem. There is a method of stopping applying radio-frequency after a pressure inside the reaction chamber is decreased by approximately half by decreasing flow rates of the process gases progressively. In-plane distribution uniformity of plasma damage using this method, however, is unchanged. Thus, in the conventional sequence, uneven discharge, which is difficult to be determined with eyes, is generated by residual gas components.

In light of the above-mentioned respects, after earnestly conducting research, the inventors of the present invention discovered an effective method for forming a thin film, which reduces plasma damage, by focusing attention on a sequence for stopping applying radio-frequency power.

FIG. 2 shows the thin-film formation sequence according to a preferred embodiment of the present invention. As shown in FIG. 2, in the thin-film formation sequence according to this embodiment, first at Time t1, introducing an additive gas and a dilution gas is started. Subsequently at Time t2, respective flow rates of the additive gas and the dilution gas are gradually increased until respective given amounts are reached. At Time t2, a pressure inside the reaction chamber starts rising. At Time t3, gradually decreasing a flow rate of the additive gas is started; supplying the additive gas is stopped at Time t4. Simultaneously at Time t4, a silicon-containing source gas is introduced at a given flow rate and a pressure inside the reaction chamber is maintained at a desired pressure level. At Time t5, applying radio-frequency power to the showerhead is started. At Time t6', supplying the silicon-containing source gas is stopped. Simultaneously at Time t6', progressively and gradually reducing an amount of radio-frequency power applied and a pressure inside the reaction chamber is started. At Time t7', applying the radio-frequency power is stopped when an amount of the radio-frequency power applied and a pressure inside the reaction chamber are reduced to ⅔-¼. The pressure is reduced at a higher rate after Time t7' in order to maintain stable condition of plasmas. At Time t8, decreasing a flow rate of the dilution gas is started and gradually decreasing a pressure inside the reaction chamber is started. At Time t9, supplying the dilution gas is stopped and the thin-film formation sequence is finished by setting a pressure inside the reaction chamber at zero.

In preferred embodiments, conditions at each point in time may be as follows:

| Point (Time length from previous point; sec.) | Additive gas (sccm) | Dilution gas (sccm) | Si-containing (sccm) | RF (W) | P (Torr) |
| --- | --- | --- | --- | --- | --- |
| t1 (0) | 0 | 0 | 0 | 0 | 0.1–5 |
| t2 (2–20) | 200–600 | 200–600 | 0 | 0 | 0.1–5 |
| t3 (2–20) | 200–600 | 200–600 | 0 | 0 | 3–10 |
| t4 (2–20) | 0 | 150–500 | 100–300 | 0 | 5–15 |
| t5 (3–300) | 0 | 150–500 | 100–300 | 500–2000 | 5–15 |
| t6' (3–15) | 0 | 100–400 | 100–300 | 500–2000 | 5–15 |
| t7' (5–15) | 0 | 100–400 | 0 | 300–1000 | 3–10 |
| t8 (2–10) | 0 | 100–400 | 0 | 0 | 1–7 |
| t9 (2–10) | 0 | 0 | 0 | 0 | 0.1–5 |

In one of preferred embodiments, a first characteristic of the present invention is: Before applying the radio-frequency power is completely stopped at Time t7, supplying the silicon-containing source gas is completely stopped at Time t6. This eliminates momentary plasma instability caused by residual gas components when applying the radio-frequency power is stopped. As a result, the occurrence of leakage current is controlled, thereby reducing plasma damage.

In one of preferred embodiments, a second characteristic of the present invention is: Plasma discharge is generated in dilution gas atmosphere with a pressure inside the reaction chamber and radio-frequency being decreased at Time t6 and Time t7. This improves adhesion between low-k films or ULK films, which have low mechanical strength, and SiC hard-mask films or SiC-containing barrier thin films. The improved adhesion is able to prevent scratches or exfoliation in the CMP process.

Figure 3:
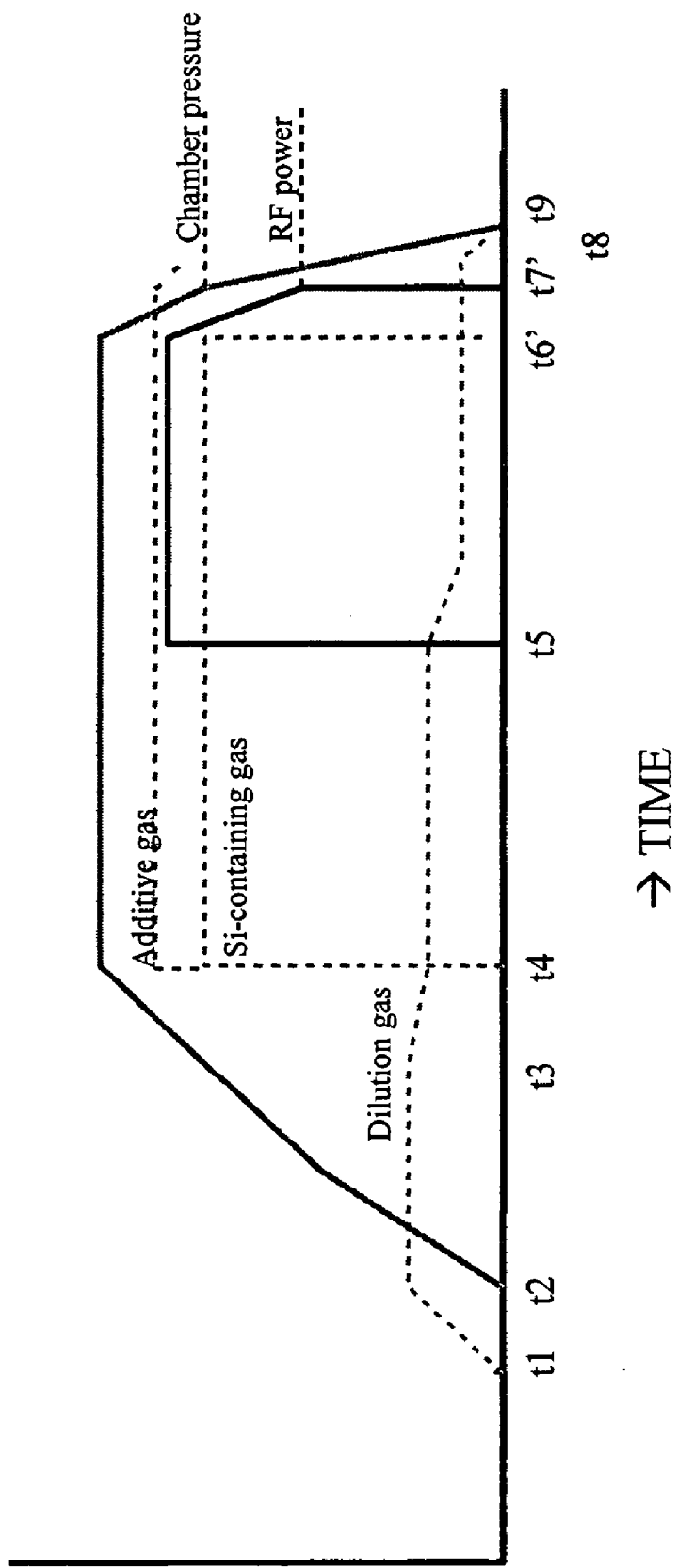
FIG. 3 is a diagram showing a thin-film formation sequence according to another embodiment of the present invention.

FIG. 3 shows a sequence according to another embodiment of the present invention. In this embodiment, the additive gas is introduced when the silicon-containing gas is introduced. The flow of the additive gas is stopped when the RF power supply is stopped. The conditions indicated in FIG. 3 can be the same as in FIG. 2 except for the additive gas flow.

The additive gas may have two functions: one is for stabilizing the pressure in the reaction chamber prior to plasma generation and facilitating heating the substrate, for example; another is for stabilizing plasma reaction, for example. FIG. 2 shows the former, and FIG. 3 shows the latter. In an embodiment, the additive gas can be used for the both purposes, i.e., the additive gas can flow before and after plasma reaction.

EXAMPLES

Evaluation experiments of insulation films formed using the method according to embodiments of the present invention were conducted and the results are described below. Table 1 shows the measurement results of surface potential, interface state density and flat band voltage of silicon-containing insulation thin films (ULK films formed using 1,3 dimethoxytetramethyldisiloxane (DMOTMDS) as a source gas, $O_2$ and isopropyl alcohol as additive gases and He as a dilution gas) formed using the comparative sequence and the sequence according to the above-mentioned embodiment of the present invention; Table 2 shows the measurement results of surface potential, interface state density and flat band voltage of silicon-containing insulation thin films (low-k films formed using dimethyldimethoxysilane as a source gas and He as a dilution gas) formed using the comparative sequence and the sequence according to the embodiment of the present invention.

TABLE 1

| | Mean | Uniformity (%) | Range | Max. Value | Min. Value |
|---|---|---|---|---|---|
| Surface Potential (V) | | | | | |
| Comparative technology | 0.077 | 0.442 | 1.608 | 0.825 | −0.783 |
| Present embodiment | −0.124 | 0.237 | 1.142 | 0.422 | −0.72 |
| Interface State Density (E11/cm$^2$ - eV) | | | | | |
| Comparative technology | 7.713 | 4.383 | 14.155 | 16.11 | 1.955 |
| Present embodiment | 3.534 | 1.282 | 3.926 | 5.707 | 1.781 |
| Flat Band Voltage (V) | | | | | |
| Comparative technology | 9.647 | 4.584 | 12.625 | 14.45 | 1.825 |
| Present embodiment | 1.437 | 1.243 | 3.423 | 3.218 | −0.205 |

TABLE 2

| | Mean | Uniformity (%) | Range | Max. Value | Min. Value |
|---|---|---|---|---|---|
| Surface Potential (V) | | | | | |
| Comparative technology | 0.383 | 0.607 | 2.36 | 1.723 | −0.637 |
| Present embodiment | 0.63 | 0.229 | 0.858 | 1.024 | 0.166 |
| Interface State Density (E11/cm$^2$ - eV) | | | | | |
| Comparative technology | 3.332 | 0.768 | 2.53 | 4.05 | 1.52 |
| Present embodiment | 3.016 | 0.488 | 1.531 | 3.485 | 1.927 |
| Flat Band Voltage (V) | | | | | |
| Comparative technology | 4.369 | 4.053 | 11.463 | 9.882 | −1.581 |
| Present embodiment | 1.909 | 1.634 | 5.057 | 5.008 | −0.049 |

From the results in Tables 1 and 2, by using the method for forming a thin film according to the embodiment of the present invention, it is seen that surface in-plane charge uniformity, interface state density and flat band voltage values have been improved significantly as compared with measurement results using the comparative technology. As a result, leakage current is reduced and plasma damage is significantly decreased.

Table 3 shows the results of evaluating adhesion of films formed by dilution gas plasma at a state in which an amount of radio-frequency power applied and a pressure inside the reaction chamber are being decreased. Measurements were conducted by gradually decreasing an amount of radio-frequency power applied from 2000 W to 400 W and gradually decreasing a pressure inside the reaction chamber up to 15-0.5 Torr. He, N$_2$, Ar, Kr, and Xe gases were used as dilution gases at a flow rate of 10-1000 sccm. A scotch tape was attached on a surface of a thin film formed; adhesion was evaluated by whether the thin film formed came off together with the scotch tape or not when the scotch tape was peeled off from the surface of the thin film.

TABLE 3

| | He | N$_2$ | Ar | Kr | Xe |
|---|---|---|---|---|---|
| Adhesion | Did not come off | Did not come off | Did not come off | Did not come off | Did not come off |

From the results shown in Table 3, it is seen that plasma discharge using He, N$_2$, Kr, Xe gases as dilution gases in a state of a low reaction-chamber pressure and a low radio-frequency power amount is effective for improving the adhesion.

Table 4 shows comparison of sticking occurrences and particle amounts between the comparative technology and the embodiment of the present invention.

TABLE 4

| | Sticking | Particle |
|---|---|---|
| Comparative technology | Infrequently occurred | 20–50 |
| Present embodiment | Did not occur | 3–30 |

From the results shown in Table 4, by using the present invention, it is seen that due to decreased residual potential, sticking occurrences were prevented. Additionally, it is seen that particle amounts caused by residual gas components were remarkably reduced as compared with the results using the comparative technology.

The present application claims priority under 35 U.S.C. § 119 to Japanese Patent Application No. 2003-311705, filed Sep. 3, 2003, the disclosure of which is incorporated herein by reference in its entirety.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method for forming a thin film comprising:
   supplying an additive gas, a dilution gas, and a silicon-containing source gas into a reaction chamber wherein a substrate is placed;
   forming a thin film on the substrate by plasma CVD under a given pressure with a given intensity of radio-frequency (RF) power from a first point in time to a second point in time;
   at the second point in time, stopping the supply of the silicon-containing source gas; and
   at the second point in time, beginning reducing but not stopping the RF power, and beginning reducing the pressure, wherein the reduction of the RF power and the reduction of the pressure are synchronized up to a third point in time.

2. The method according to claim 1, wherein at the third point in time, the RF power is about ⅔ to about ¼ of that at the second point in time.

3. The method according to claim 1, wherein the RF power is reduced at a constant rate between the second point in time and the third point in time.

4. The method according to claim 1, wherein at the third point in time, the RF power is discontinued.

5. The method according to claim 1, wherein between the second point in time and the third point in time, the dilution gas is continuously supplied.

6. The method according to claim 5, wherein between the second point in time and the third point in time, the dilution gas flow is constant.

7. The method according to claim 1, wherein the supply of the additive gas begins before the supply of the silicon-containing gas begins, and the supply of the additive gas stops when the supply of the silicon-containing gas begins.

8. The method according to claim 1, wherein the supply of the additive gas begins when the supply of the silicon-containing gas begins, and the supply of the additive gas stops at the third point in time.

9. The method according to claim 1, wherein the thin film formed on the substrate is constituted by silicon oxide.

10. The method according to claim 1, wherein the supply of the silicon-containing gas begins a given time period before the first point in time, said given time period being longer than a time period between the first point in time and the second point in time.

11. The method according to claim 1, wherein a time period between the second point in time and the third point in time is about 5 sec to about 20 sec.

12. The method according to claim 1, wherein between the first point in time and the second point in time, the pressure, the RF power, and the silicon-containing gas flow are constant.

13. The method according to claim 12, wherein between the first point in time and the second point in time, the additive gas flow is reduced.

14. The method according to claim 1, wherein in the step of supplying the gases, the substrate is heated at temperature of about 50° C. to about 550° C.

15. The method according to claim 1, wherein the additive gas is at least one selected from the group consisting of $CO_2$, CO, $O_2$, $H_2$, $C_nH_{2n+2}$ (n=1-5) and $C_nH_{2n+2}O$ (n=1-5).

16. The method according to claim 15, wherein the additive gas is supplied at about 5 sccm to about 1000 sccm.

17. The method according to claim 1, wherein the dilution gas is at least one selected from the group consisting of $N_2$, He, Ar, Kr, and Xe.

18. The method according to claim 17, wherein the dilution gas is supplied at about 10 sccm to about 1000 sccm.

19. The method according to claim 1, wherein the silicon-containing source gas is at least one selected from the group consisting of $SiH_4$, TEOS, and $Si_aO_{a-1}R_{2a-b+2}$ $(OC_nH_{2n+1})_b$, wherein a=1-3; b=0, 1 or 2; n=1-3; R is hydrocarbon of $C_{1-6}$ bonded to Si.

20. The method according to claim 19, wherein the silicon-containing source gas is supplied at about 50 sccm to about 400 sccm.

21. The method according to claim 1, wherein the given pressure in the step of forming the thin film is about 1 Torr to about 30 Torr.

22. The method according to claim 1, wherein the radio-frequency power has a frequency of about 13.56 MHz to about 60 MHz and a power of about 500 W to about 4,000 W.

23. A method for forming a thin film comprising:

placing a semiconductor substrate into a reaction chamber;

heating the semiconductor substrate at a given temperature;

introducing an additive gas into the reaction chamber;

introducing a given amount of dilution gas into the reaction chamber;

introducing a given amount of silicon-containing source gas into the reaction chamber and maintaining a pressure inside the reaction chamber at a given level;

applying radio-frequency power to the inside of the reaction chamber;

stopping supplying the silicon-containing source gas;

simultaneously when supplying the silicon-containing source gas is stopped, reducing the pressure inside the reaction chamber and the amount of the radio-frequency power to a desired level progressively at a given rate;

stopping applying the radio-frequency power; and stopping supplying the dilution gas, wherein the desired level is from about ⅔ to about ¼ of that before the reduction of the pressure inside the reaction chamber and the amount of the radio-frequency power.

24. The method according to claim 23, wherein the additive gas is at least one selected from the group consisting of $CO_2$, CO, $O_2$, $H_2$, $C_nH_{2n+2}$ (n=1-5), and $C_nH_{2n+2}O$ (n=1-5).

25. The method according to claim 23, wherein the dilution gas is at least one selected from the group consisting of $N_2$, He, Ar, Kr, and Xe.

26. The method according to claim 23, wherein the silicon-containing source gas is at least one selected from the group consisting of $SiH_4$, TEOS, and $Si_aOa_{a-1}R_{2a-b+2}$ $(OC_nH_{2n+1})_b$, wherein a=1-3; b=0, 1 or 2; n=1-3; R is hydrocarbon of $C_{1-6}$ bonded to Si.

* * * * *